United States Patent
Sommer et al.

(10) Patent No.: US 8,259,506 B1
(45) Date of Patent: Sep. 4, 2012

(54) DATABASE OF MEMORY READ THRESHOLDS

(75) Inventors: Naftali Sommer, Rishon Le-Zion (IL); Uri Perlmutter, Raanana (IL)

(73) Assignee: Apple Inc., Cupertino, CA (US)

( * ) Notice: Subject to any disclaimer, the term of this patent is extended or adjusted under 35 U.S.C. 154(b) by 344 days.

(21) Appl. No.: 12/728,296

(22) Filed: Mar. 22, 2010

Related U.S. Application Data

(60) Provisional application No. 61/163,138, filed on Mar. 25, 2009, provisional application No. 61/234,695, filed on Aug. 18, 2009.

(51) Int. Cl.
*G11C 16/04* (2006.01)

(52) U.S. Cl. ......... 365/185.24; 365/185.03; 365/185.18; 365/185.21; 365/185.22; 365/210.12

(58) Field of Classification Search ............. 365/185.24, 365/185.03, 185.18, 185.21, 185.22, 210.12
See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |
| 4,558,431 A | 12/1985 | Satoh | |
| 4,608,687 A | 8/1986 | Dutton | |
| 4,654,847 A | 3/1987 | Dutton | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |

(Continued)

FOREIGN PATENT DOCUMENTS

EP 0783754 B1 7/1997

(Continued)

OTHER PUBLICATIONS

U.S. Appl. No. 12/323,544 Office Action dated Dec. 13, 2011.

(Continued)

*Primary Examiner* — Viet Q Nguyen
(74) *Attorney, Agent, or Firm* — Meyertons, Hood, Kivlin, Kowert & Goetzel, P.C.

(57) ABSTRACT

A method for data storage includes storing multiple sets each including one or more read thresholds for use in reading data from a plurality of analog memory cells. The memory cells are arranged in multiple erasure blocks each including multiple pages, and each set of read thresholds is associated with a respective page in one of the erasure blocks. A first page, which belongs to a given erasure block and is not associated with any of the stored sets of read thresholds, is read by retrieving a stored set of read thresholds that is associated with a second page in the given erasure block, adapting the retrieved set of read thresholds to match the first page, and reading the first page using the adapted set of read thresholds.

41 Claims, 3 Drawing Sheets

U.S. PATENT DOCUMENTS

| | | | |
|---|---|---|---|
| 5,172,338 A | 12/1992 | Mehrotta et al. | |
| 5,182,558 A | 1/1993 | Mayo | |
| 5,182,752 A | 1/1993 | DeRoo et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,446,854 A | 8/1995 | Khalidi et al. | |
| 5,450,424 A | 9/1995 | Okugaki et al. | |
| 5,469,444 A | 11/1995 | Endoh et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,533,190 A | 7/1996 | Binford et al. | |
| 5,541,886 A | 7/1996 | Hasbun | |
| 5,598,368 A * | 1/1997 | Takahashi et al. | 365/185.01 |
| 5,600,677 A | 2/1997 | Citta et al. | |
| 5,638,320 A | 6/1997 | Wong et al. | |
| 5,657,332 A | 8/1997 | Auclair et al. | |
| 5,675,540 A | 10/1997 | Roohparvar | |
| 5,682,352 A | 10/1997 | Wong et al. | |
| 5,687,114 A | 11/1997 | Khan | |
| 5,696,717 A | 12/1997 | Koh | |
| 5,726,649 A | 3/1998 | Tamaru et al. | |
| 5,726,934 A | 3/1998 | Tran et al. | |
| 5,742,752 A | 4/1998 | De Koening | |
| 5,748,533 A | 5/1998 | Dunlap et al. | |
| 5,748,534 A | 5/1998 | Dunlap et al. | |
| 5,751,637 A | 5/1998 | Chen et al. | |
| 5,761,402 A | 6/1998 | Kaneda et al. | |
| 5,798,966 A | 8/1998 | Keeney | |
| 5,799,200 A | 8/1998 | Brant et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,428 A | 2/1999 | Ishii et al. | |
| 5,867,429 A | 2/1999 | Chen et al. | |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,946,716 A | 8/1999 | Karp et al. | |
| 5,969,986 A | 10/1999 | Wong et al. | |
| 5,982,668 A | 11/1999 | Ishii et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,009,016 A | 12/1999 | Ishii et al. | |
| 6,023,425 A | 2/2000 | Ishii et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,151,246 A | 11/2000 | So et al. | |
| 6,157,573 A | 12/2000 | Ishii et al. | |
| 6,166,962 A | 12/2000 | Chen et al. | |
| 6,169,691 B1 | 1/2001 | Pasotti et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,259,627 B1 | 7/2001 | Wong | |
| 6,275,419 B1 | 8/2001 | Guterman et al. | |
| 6,278,632 B1 | 8/2001 | Chevallier | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,314,044 B1 | 11/2001 | Sasaki et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,385,092 B1 | 5/2002 | Ishii et al. | |
| 6,392,932 B1 | 5/2002 | Ishii et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,405,342 B1 | 6/2002 | Lee | |
| 6,418,060 B1 | 7/2002 | Yong et al. | |
| 6,442,585 B1 | 8/2002 | Dean et al. | |
| 6,445,602 B1 | 9/2002 | Kokudo et al. | |
| 6,452,838 B1 | 9/2002 | Ishii et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,480,948 B1 | 11/2002 | Virajpet et al. | |
| 6,490,236 B1 | 12/2002 | Fukuda et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,549,464 B2 | 4/2003 | Tanaka et al. | |
| 6,553,510 B1 | 4/2003 | Pekny et al. | |
| 6,558,967 B1 | 5/2003 | Wong | |
| 6,560,152 B1 | 5/2003 | Cernea | |
| 6,567,311 B2 | 5/2003 | Ishii et al. | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzales et al. | |
| 6,640,326 B1 | 10/2003 | Buckingham et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,683,811 B2 | 1/2004 | Ishii et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,732,250 B2 | 5/2004 | Durrant | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,792,412 B1 * | 9/2004 | Sullivan et al. | 706/25 |
| 6,804,805 B2 | 10/2004 | Rub | |
| 6,807,095 B2 | 10/2004 | Chen et al. | |
| 6,807,101 B2 | 10/2004 | Ooishi et al. | |
| 6,809,964 B2 | 10/2004 | Moschopoulos et al. | |
| 6,809,967 B2 * | 10/2004 | Noguchi et al. | 365/185.22 |
| 6,819,592 B2 | 11/2004 | Noguchi et al. | |
| 6,829,167 B2 | 12/2004 | Tu et al. | |
| 6,845,052 B1 | 1/2005 | Ho et al. | |

| | | | |
|---|---|---|---|
| 6,851,018 B2 | 2/2005 | Wyatt et al. | |
| 6,851,081 B2 | 2/2005 | Yamamoto | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,870,773 B2 | 3/2005 | Noguchi et al. | |
| 6,873,552 B2 | 3/2005 | Ishii et al. | |
| 6,879,520 B2 | 4/2005 | Hosono et al. | |
| 6,882,567 B1 | 4/2005 | Wong | |
| 6,894,926 B2 | 5/2005 | Guterman et al. | |
| 6,907,497 B2 | 6/2005 | Hosono et al. | |
| 6,912,161 B2 * | 6/2005 | Hirano et al. | 365/185.24 |
| 6,925,009 B2 | 8/2005 | Noguchi et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,941,432 B2 * | 9/2005 | Ronstrom | 711/165 |
| 6,958,938 B2 | 10/2005 | Noguchi et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 6,999,344 B2 | 2/2006 | Hosono et al. | |
| 7,002,843 B2 | 2/2006 | Guterman et al. | |
| 7,006,379 B2 | 2/2006 | Noguchi et al. | |
| 7,009,881 B2 * | 3/2006 | Noguchi | 365/185.17 |
| 7,012,835 B2 | 3/2006 | Gonzales et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,071,849 B2 | 7/2006 | Zhang | |
| 7,072,222 B2 | 7/2006 | Ishii et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,145,805 B2 | 12/2006 | Ishii et al. | |
| 7,151,692 B2 | 12/2006 | Wu | |
| 7,158,058 B1 | 1/2007 | Yu | |
| 7,170,781 B2 | 1/2007 | So et al. | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzales et al. | |
| 7,177,199 B2 | 2/2007 | Chen et al. | |
| 7,177,200 B2 | 2/2007 | Ronen et al. | |
| 7,184,338 B2 | 2/2007 | Nakagawa et al. | |
| 7,187,195 B2 | 3/2007 | Kim | |
| 7,187,592 B2 | 3/2007 | Guterman et al. | |
| 7,190,614 B2 | 3/2007 | Wu | |
| 7,193,898 B2 | 3/2007 | Cernea | |
| 7,193,921 B2 | 3/2007 | Choi et al. | |
| 7,196,644 B1 | 3/2007 | Anderson et al. | |
| 7,196,928 B2 | 3/2007 | Chen | |
| 7,196,933 B2 | 3/2007 | Shibata | |
| 7,197,594 B2 | 3/2007 | Raz et al. | |
| 7,200,062 B2 | 4/2007 | Kinsely et al. | |
| 7,210,077 B2 | 4/2007 | Brandenberger et al. | |
| 7,221,592 B2 | 5/2007 | Nazarian | |
| 7,224,613 B2 | 5/2007 | Chen et al. | |
| 7,231,474 B1 | 6/2007 | Helms et al. | |
| 7,231,562 B2 | 6/2007 | Ohlhoff et al. | |
| 7,243,275 B2 | 7/2007 | Gongwer et al. | |
| 7,254,690 B2 | 8/2007 | Rao | |
| 7,254,763 B2 | 8/2007 | Aadsen et al. | |
| 7,257,027 B2 | 8/2007 | Park | |
| 7,259,987 B2 | 8/2007 | Chen et al. | |
| 7,266,026 B2 | 9/2007 | Gongwer et al. | |
| 7,266,069 B2 | 9/2007 | Chu | |
| 7,269,066 B2 | 9/2007 | Nguyen et al. | |
| 7,272,757 B2 | 9/2007 | Stocken | |
| 7,274,611 B2 | 9/2007 | Roohparvar | |
| 7,277,355 B2 | 10/2007 | Tanzana | |
| 7,280,398 B1 | 10/2007 | Lee et al. | |
| 7,280,409 B2 | 10/2007 | Misumi et al. | |
| 7,280,415 B2 | 10/2007 | Hwang et al. | |
| 7,283,399 B2 | 10/2007 | Ishii et al. | |
| 7,289,344 B2 | 10/2007 | Chen | |
| 7,301,807 B2 | 11/2007 | Khalid et al. | |
| 7,301,817 B2 | 11/2007 | Li et al. | |
| 7,308,525 B2 | 12/2007 | Lasser et al. | |
| 7,310,255 B2 | 12/2007 | Chan | |
| 7,310,269 B2 | 12/2007 | Shibata | |
| 7,310,271 B2 | 12/2007 | Lee | |
| 7,310,272 B1 | 12/2007 | Mokhesi et al. | |
| 7,310,347 B2 | 12/2007 | Lasser | |
| 7,312,727 B1 | 12/2007 | Feng et al. | |
| 7,321,509 B2 | 1/2008 | Chen et al. | |
| 7,328,384 B1 | 2/2008 | Kulkarni et al. | |
| 7,342,831 B2 | 3/2008 | Mokhlesi et al. | |
| 7,343,330 B1 | 3/2008 | Boesjes et al. | |
| 7,345,924 B2 | 3/2008 | Nguyen et al. | |
| 7,345,928 B2 | 3/2008 | Li | |
| 7,349,249 B2 * | 3/2008 | Honma et al. | 365/185.03 |
| 7,349,263 B2 | 3/2008 | Kim et al. | |
| 7,356,755 B2 | 4/2008 | Fackenthal | |
| 7,363,420 B2 | 4/2008 | Lin et al. | |
| 7,365,671 B1 | 4/2008 | Anderson | |
| 7,388,781 B2 | 6/2008 | Litsyn et al. | |
| 7,397,697 B2 | 7/2008 | So et al. | |
| 7,405,974 B2 | 7/2008 | Yaoi et al. | |
| 7,405,979 B2 | 7/2008 | Ishii et al. | |
| 7,408,804 B2 | 8/2008 | Hemink et al. | |
| 7,408,810 B2 | 8/2008 | Aritome et al. | |
| 7,409,473 B2 | 8/2008 | Conley et al. | |
| 7,409,623 B2 | 8/2008 | Baker et al. | |
| 7,420,847 B2 | 9/2008 | Li | |
| 7,433,231 B2 | 10/2008 | Aritome | |
| 7,433,697 B2 | 10/2008 | Karaoguz et al. | |
| 7,434,111 B2 | 10/2008 | Sugiura et al. | |
| 7,437,498 B2 | 10/2008 | Ronen | |
| 7,440,324 B2 | 10/2008 | Mokhlesi | |
| 7,440,331 B2 | 10/2008 | Hemink | |
| 7,441,067 B2 | 10/2008 | Gorobetz et al. | |
| 7,447,970 B2 | 11/2008 | Wu et al. | |
| 7,450,421 B2 | 11/2008 | Mokhlesi et al. | |
| 7,453,737 B2 | 11/2008 | Ha | |
| 7,457,163 B2 | 11/2008 | Hemink | |
| 7,457,897 B1 | 11/2008 | Lee et al. | |
| 7,460,410 B2 | 12/2008 | Nagai et al. | |
| 7,460,412 B2 | 12/2008 | Lee et al. | |
| 7,466,592 B2 | 12/2008 | Mitani et al. | |
| 7,468,907 B2 | 12/2008 | Kang et al. | |
| 7,468,911 B2 | 12/2008 | Lutze et al. | |
| 7,469,049 B1 | 12/2008 | Feng | |
| 7,471,581 B2 | 12/2008 | Tran et al. | |
| 7,483,319 B2 | 1/2009 | Brown | |
| 7,487,329 B2 | 2/2009 | Hepkin et al. | |
| 7,487,394 B2 | 2/2009 | Forhan et al. | |
| 7,492,641 B2 | 2/2009 | Hosono et al. | |
| 7,508,710 B2 | 3/2009 | Mokhlesi | |
| 7,526,711 B2 | 4/2009 | Orio | |
| 7,539,061 B2 | 5/2009 | Lee | |
| 7,539,062 B2 | 5/2009 | Doyle | |
| 7,545,677 B2 * | 6/2009 | Lee et al. | 365/185.18 |
| 7,551,492 B2 | 6/2009 | Kim | |
| 7,558,109 B2 | 7/2009 | Brandman et al. | |
| 7,558,839 B2 | 7/2009 | McGovern | |
| 7,568,135 B2 | 7/2009 | Cornwell et al. | |
| 7,570,520 B2 | 8/2009 | Kamei et al. | |
| 7,574,555 B2 | 8/2009 | Porat et al. | |
| 7,590,002 B2 | 9/2009 | Mokhlesi et al. | |
| 7,593,259 B2 | 9/2009 | Kim | |
| 7,594,093 B1 | 9/2009 | Kancherla | |
| 7,596,707 B1 | 9/2009 | Vemula | |

| | | | |
|---|---|---|---|
| 7,609,787 B2 | 10/2009 | Jahan et al. | |
| 7,613,043 B2 | 11/2009 | Cornwell et al. | |
| 7,616,498 B2 | 11/2009 | Mokhlesi et al. | |
| 7,619,918 B2 | 11/2009 | Aritome | |
| 7,631,245 B2 | 12/2009 | Lasser | |
| 7,633,798 B2 | 12/2009 | Sarin et al. | |
| 7,633,802 B2 | 12/2009 | Mokhlesi | |
| 7,639,532 B2 | 12/2009 | Roohparvar et al. | |
| 7,644,347 B2 | 1/2010 | Alexander et al. | |
| 7,652,928 B2 * | 1/2010 | Yanagidaira et al. | 365/185.23 |
| 7,656,734 B2 | 2/2010 | Thorp et al. | |
| 7,660,158 B2 | 2/2010 | Aritome | |
| 7,660,183 B2 | 2/2010 | Ware et al. | |
| 7,661,000 B2 | 2/2010 | Ueda et al. | |
| 7,661,054 B2 | 2/2010 | Huffman et al. | |
| 7,665,007 B2 | 2/2010 | Yang et al. | |
| 7,680,987 B1 | 3/2010 | Clark et al. | |
| 7,733,712 B1 | 6/2010 | Walston et al. | |
| 7,742,351 B2 | 6/2010 | Inoue et al. | |
| 7,761,624 B2 | 7/2010 | Karamcheti et al. | |
| 7,773,413 B2 * | 8/2010 | Shalvi | 365/185.02 |
| 7,797,609 B2 | 9/2010 | Neuman | |
| 7,810,017 B2 | 10/2010 | Radke | |
| 7,848,149 B2 | 12/2010 | Gonzales et al. | |
| 7,869,273 B2 | 1/2011 | Lee et al. | |
| 7,881,108 B2 * | 2/2011 | Cornwell et al. | 365/185.09 |
| 7,885,119 B2 | 2/2011 | Li | |
| 7,904,783 B2 | 3/2011 | Brandman et al. | |
| 7,928,497 B2 | 4/2011 | Yaegashi | |
| 7,929,549 B1 | 4/2011 | Talbot | |
| 7,930,515 B2 | 4/2011 | Gupta et al. | |
| 7,945,825 B2 | 5/2011 | Cohen et al. | |
| 7,975,192 B2 * | 7/2011 | Sommer et al. | 714/719 |
| 7,978,516 B2 | 7/2011 | Olbrich et al. | |
| 7,995,388 B1 * | 8/2011 | Winter et al. | 365/185.03 |
| 8,014,094 B1 | 9/2011 | Jin | |
| 8,037,380 B2 | 10/2011 | Cagno et al. | |
| 8,040,744 B2 | 10/2011 | Gorobets et al. | |
| 8,065,583 B2 | 11/2011 | Radke | |
| 2001/0002172 A1 | 5/2001 | Tanaka et al. | |
| 2001/0006479 A1 | 7/2001 | Ikehashi et al. | |
| 2002/0038440 A1 | 3/2002 | Barkan | |
| 2002/0056064 A1 | 5/2002 | Kidorf et al. | |
| 2002/0118574 A1 | 8/2002 | Gongwer et al. | |
| 2002/0133684 A1 | 9/2002 | Anderson | |
| 2002/0166091 A1 | 11/2002 | Kidorf et al. | |
| 2002/0174295 A1 | 11/2002 | Ulrich et al. | |
| 2002/0196510 A1 | 12/2002 | Hietala et al. | |
| 2003/0002348 A1 | 1/2003 | Chen et al. | |
| 2003/0103400 A1 | 6/2003 | Van Tran | |
| 2003/0161183 A1 | 8/2003 | Van Tran | |
| 2003/0189856 A1 | 10/2003 | Cho et al. | |
| 2004/0057265 A1 | 3/2004 | Mirabel et al. | |
| 2004/0057285 A1 | 3/2004 | Cernea et al. | |
| 2004/0083333 A1 | 4/2004 | Chang et al. | |
| 2004/0083334 A1 | 4/2004 | Chang et al. | |
| 2004/0105311 A1 | 6/2004 | Cernea et al. | |
| 2004/0114437 A1 | 6/2004 | Li | |
| 2004/0160842 A1 | 8/2004 | Fukiage | |
| 2004/0223371 A1 | 11/2004 | Roohparvar | |
| 2005/0007802 A1 | 1/2005 | Gerpheide | |
| 2005/0013165 A1 | 1/2005 | Ban | |
| 2005/0024941 A1 | 2/2005 | Lasser et al. | |
| 2005/0024978 A1 | 2/2005 | Ronen | |
| 2005/0030788 A1 | 2/2005 | Parkinson et al. | |
| 2005/0086574 A1 | 4/2005 | Fackenthal | |
| 2005/0121436 A1 | 6/2005 | Kamitani et al. | |
| 2005/0144361 A1 | 6/2005 | Gonzalez et al. | |
| 2005/0157555 A1 | 7/2005 | Ono et al. | |
| 2005/0162913 A1 | 7/2005 | Chen | |
| 2005/0169051 A1 | 8/2005 | Khalid et al. | |
| 2005/0189649 A1 | 9/2005 | Maruyama et al. | |
| 2005/0213393 A1 | 9/2005 | Lasser | |
| 2005/0224853 A1 | 10/2005 | Ohkawa | |
| 2005/0240745 A1 | 10/2005 | Iyer et al. | |
| 2005/0243626 A1 | 11/2005 | Ronen | |
| 2006/0004952 A1 | 1/2006 | Lasser | |
| 2006/0028875 A1 | 2/2006 | Avraham et al. | |
| 2006/0028877 A1 | 2/2006 | Meir | |
| 2006/0101193 A1 | 5/2006 | Murin | |
| 2006/0106972 A1 | 5/2006 | Gorobets et al. | |
| 2006/0107136 A1 | 5/2006 | Gongwer et al. | |
| 2006/0129750 A1 | 6/2006 | Lee et al. | |
| 2006/0133141 A1 | 6/2006 | Gorobets | |
| 2006/0156189 A1 | 7/2006 | Tomlin | |
| 2006/0179334 A1 | 8/2006 | Brittain et al. | |
| 2006/0190699 A1 | 8/2006 | Lee | |
| 2006/0203546 A1 | 9/2006 | Lasser | |
| 2006/0218359 A1 | 9/2006 | Sanders et al. | |
| 2006/0221692 A1 | 10/2006 | Chen | |
| 2006/0221705 A1 | 10/2006 | Hemink et al. | |
| 2006/0221714 A1 | 10/2006 | Li et al. | |
| 2006/0239077 A1 | 10/2006 | Park et al. | |
| 2006/0239081 A1 | 10/2006 | Roohparvar | |
| 2006/0256620 A1 | 11/2006 | Nguyen et al. | |
| 2006/0256626 A1 | 11/2006 | Werner et al. | |
| 2006/0256891 A1 | 11/2006 | Yuan et al. | |
| 2006/0271748 A1 | 11/2006 | Jain et al. | |
| 2006/0285392 A1 | 12/2006 | Incarnati et al. | |
| 2006/0285396 A1 | 12/2006 | Ha | |
| 2007/0006013 A1 | 1/2007 | Moshayedi et al. | |
| 2007/0019481 A1 | 1/2007 | Park | |
| 2007/0033581 A1 | 2/2007 | Tomlin et al. | |
| 2007/0047314 A1 | 3/2007 | Goda et al. | |
| 2007/0047326 A1 | 3/2007 | Nguyen et al. | |
| 2007/0050536 A1 | 3/2007 | Kolokowsky | |
| 2007/0058446 A1 | 3/2007 | Hwang et al. | |
| 2007/0061502 A1 | 3/2007 | Lasser et al. | |
| 2007/0067667 A1 | 3/2007 | Ikeuchi et al. | |
| 2007/0074093 A1 | 3/2007 | Lasser | |
| 2007/0086239 A1 | 4/2007 | Litsyn et al. | |
| 2007/0086260 A1 | 4/2007 | Sinclair | |
| 2007/0089034 A1 | 4/2007 | Litsyn et al. | |
| 2007/0091677 A1 | 4/2007 | Lasser et al. | |
| 2007/0091694 A1 | 4/2007 | Lee et al. | |
| 2007/0103978 A1 | 5/2007 | Conley et al. | |
| 2007/0103986 A1 | 5/2007 | Chen | |
| 2007/0104211 A1 | 5/2007 | Opsasnick | |
| 2007/0109845 A1 | 5/2007 | Chen | |
| 2007/0109849 A1 | 5/2007 | Chen | |
| 2007/0115726 A1 | 5/2007 | Cohen et al. | |
| 2007/0118713 A1 | 5/2007 | Guterman et al. | |
| 2007/0143378 A1 | 6/2007 | Gorobetz | |
| 2007/0143531 A1 | 6/2007 | Atri | |
| 2007/0159889 A1 | 7/2007 | Kang et al. | |
| 2007/0159892 A1 | 7/2007 | Kang et al. | |
| 2007/0159907 A1 | 7/2007 | Kwak | |
| 2007/0168837 A1 | 7/2007 | Murin | |
| 2007/0171714 A1 | 7/2007 | Wu et al. | |
| 2007/0183210 A1 | 8/2007 | Choi et al. | |
| 2007/0189073 A1 | 8/2007 | Aritome | |
| 2007/0195602 A1 | 8/2007 | Fong et al. | |
| 2007/0206426 A1 | 9/2007 | Mokhlesi | |
| 2007/0208904 A1 | 9/2007 | Hsieh et al. | |
| 2007/0226599 A1 | 9/2007 | Motwani | |
| 2007/0236990 A1 | 10/2007 | Aritome | |
| 2007/0253249 A1 | 11/2007 | Kang et al. | |
| 2007/0256620 A1 | 11/2007 | Viggiano et al. | |
| 2007/0263455 A1 | 11/2007 | Cornwell et al. | |
| 2007/0266232 A1 | 11/2007 | Rodgers et al. | |
| 2007/0271424 A1 | 11/2007 | Lee et al. | |
| 2007/0280000 A1 | 12/2007 | Fujiu et al. | |
| 2007/0291571 A1 | 12/2007 | Balasundaram | |
| 2007/0297234 A1 | 12/2007 | Cernea et al. | |
| 2008/0010395 A1 | 1/2008 | Mylly et al. | |
| 2008/0025121 A1 | 1/2008 | Tanzawa | |
| 2008/0043535 A1 | 2/2008 | Roohparvar | |
| 2008/0049504 A1 | 2/2008 | Kasahara et al. | |
| 2008/0049506 A1 | 2/2008 | Guterman | |
| 2008/0052446 A1 | 2/2008 | Lasser et al. | |
| 2008/0055993 A1 | 3/2008 | Lee | |
| 2008/0080243 A1 | 4/2008 | Edahiro et al. | |
| 2008/0082730 A1 | 4/2008 | Kim et al. | |
| 2008/0089123 A1 | 4/2008 | Chae et al. | |
| 2008/0104309 A1 | 5/2008 | Cheon et al. | |
| 2008/0104312 A1 | 5/2008 | Lasser | |
| 2008/0109590 A1 | 5/2008 | Jung et al. | |
| 2008/0115017 A1 | 5/2008 | Jacobson | |

| | | |
|---|---|---|
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | | |
|---|---|---|---|
| EP | 1434236 | B1 | 6/2004 |
| EP | 1605509 | A1 | 12/2005 |
| WO | 9610256 | A1 | 4/1996 |
| WO | 98028745 | A1 | 7/1998 |
| WO | 02100112 | A1 | 12/2002 |
| WO | 03100791 | A1 | 12/2003 |
| WO | 2007046084 | A2 | 4/2007 |
| WO | 2007132452 | A2 | 11/2007 |
| WO | 2007132453 | A2 | 11/2007 |
| WO | 2007132456 | A2 | 11/2007 |
| WO | 2007132457 | A2 | 11/2007 |
| WO | 2007132458 | A2 | 11/2007 |
| WO | 2007146010 | A2 | 12/2007 |
| WO | 2008026203 | A2 | 3/2008 |
| WO | 2008053472 | A2 | 5/2008 |
| WO | 2008053473 | A2 | 5/2008 |
| WO | 2008068747 | A2 | 6/2008 |
| WO | 2008077284 | A1 | 7/2008 |
| WO | 2008083131 | A2 | 7/2008 |
| WO | 2008099958 | A1 | 8/2008 |
| WO | 2008111058 | A2 | 9/2008 |
| WO | 2008124760 | A2 | 10/2008 |
| WO | 2008139441 | A2 | 11/2008 |
| WO | 2009037691 | A2 | 3/2009 |
| WO | 2009037697 | A2 | 3/2009 |
| WO | 2009038961 | A2 | 3/2009 |
| WO | 2009050703 | A2 | 4/2009 |
| WO | 2009053961 | A2 | 4/2009 |
| WO | 2009053962 | A2 | 4/2009 |
| WO | 2009053963 | A2 | 4/2009 |
| WO | 2009063450 | A2 | 5/2009 |
| WO | 2009072100 | A2 | 6/2009 |
| WO | 2009072101 | A2 | 6/2009 |
| WO | 2009072102 | A2 | 6/2009 |
| WO | 2009072103 | A2 | 6/2009 |
| WO | 2009072104 | A2 | 6/2009 |
| WO | 2009072105 | A2 | 6/2009 |
| WO | 2009074978 | A2 | 6/2009 |
| WO | 2009074979 | A2 | 6/2009 |
| WO | 2009078006 | A2 | 6/2009 |
| WO | 2009095902 | A2 | 8/2009 |
| WO | 2011024015 | A1 | 3/2011 |

OTHER PUBLICATIONS

U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
UBUNTU Forums, "Memory Stick Failed IO Superblock", posted Nov. 11, 2009.
Super User Forums, "SD Card Failure, can't read superblock", posted Aug. 8, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May, 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Onfi, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Takeuchi et al., "A Multipage Cell Architecture for High-Speed Programming Multilevel NAND Flash Memories", IEEE Journal of Solid State Circuits, vol. 33, No. 8, Aug. 1998.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.

International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation for Voltage Drifts in Analog Memory Cells" filed Oct. 15, 2008.
Sommer et al., U.S. Appl. No. 12/497,707 "Data Storage in Analog Memory Cells with Protection Against Programming Interruption" filed Jul. 6, 2009.
Winter et al., U.S. Appl. No. 12/534,893 "Improved Data Storage in Analog Memory Cells Using Modified Pass Voltages" filed Aug. 4, 2009.
Winter et al., U.S. Appl. No. 12/534,898 "Data Storage Using Modified Voltages" filed Aug. 4, 2009.
Shalvi et al., U.S. Appl. No. 12/551,583 "Segmented Data Storage" filed Sep. 1, 2009.
Shalvi et al., U.S. Appl. No. 12/551,567 "Reliable Date Storage in Analog Memory Cells Subjected to Long Retention Periods" filed Sep. 1, 2009.
Perlmutter et al., U.S. Appl. No. 12/558,528 "Estimation of Memory Cell Read Thresholds by Sampling Inside Programming Level Distribution Intervals" filed Sep. 13, 2009.
Sokolov, D., U.S. Appl. No. 12/579,430 "Efficient Programming of Analog Memory Cell Devices" filed Oct. 15, 2009.
Shalvi, O., U.S. Appl. No. 12/579,432 "Efficient Data Storage in Storage Device Arrays" filed Oct. 15, 2009.
Sommer et al., U.S. Appl. No. 12/607,078 "Data Scrambling in Memory Devices" filed Oct. 28, 2009.
Sommer et al., U.S. Appl. No. 12/607,085 "Data Scrambling Schemes for Memory Devices" filed Oct. 28, 2009.
Shalvi et al., U.S. Appl. No. 12/618,732 "Storage at M Bits/Cell Density in N Bits/Cell Analog Memory Cell Devices, M>N" filed Nov. 15, 2009.
Sommer et al., U.S. Appl. No. 12/649,358 "Efficient Readout Schemes for Analog Memory Cell Devices" filed Dec. 30, 2009.
Sommer et al., U.S. Appl. No. 12/649,360 "Efficient Readout Schemes for Analog Memory Cell Devices Using Multiple Read Threshold Sets" filed Dec. 30, 2009.
Rotbard et al., U.S. Appl. No. 12/649,382 "Rejuvenation of Analog Memory Cells" filed Dec. 30, 2009.
Shachar et al., U.S. Appl. No. 12/688,883 "Hierarchical data storage system" filed Jan. 17, 2010.
JEDEC Standard JESD84-C44, "Embedded MultiMediaCard (e•MMC) Mechanical Standard, with Optional Reset Signal", JEDEC Solid State Technology Association, USA, Jul. 2009.
JEDEC, "UFS Specification", version 0.1, Nov. 11, 2009.
Compaq et al., "Universal Serial Bus Specification", revision 2.0, Apr. 27, 2000.
SD Group & SD Card Association, "SD Specifications Part 1 Physical Layer Specification", version 3.01, draft 1.00, Nov. 9, 2009.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Shalvi, O., U.S. Appl. No. 12/758,044 "Memory device with negative thresholds" filed Apr. 12, 2010.
Sokolov et al., U.S. Appl. No. 12/714,501 "Selective Activation of Programming Schemes in Analog Memory Cell Arrays" filed Feb. 28, 2010.
Sokolov et al., U.S. Appl. No. 12/728,287 "Use of host system resources by memory controller" filed Mar. 22, 2010.
Sommer et al., U.S. Appl. No. 12/728,296 "Database of Memory Read Thresholds" filed Mar. 22, 2010.

Sommer et al., U.S. Appl. No. 12/758,003 "Selective re-programming of analog memory cells" filed Apr. 11, 2010.
Shalvi et al., U.S. Appl. No. 12/551,567 "Reliable Data Storage in Analog Memory Cells Subjected to Long Retention Periods" filed Sep. 1, 2009.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 131239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.

Budilovsky et al., "Prototyping a High-Performance Low-Cost Solid-State Disk", SYSTOR—The 4th Annual International Systems and Storage Conference, Haifa, Israel, May 30-Jun. 1, 2011.

NVM Express Protocol, "NVM Express", Revision 1.0b, Jul. 12, 2011.

SCSI Protocol, "Information Technology—SCSI Architecture Model—5 (SAM-5)", INCITS document T10/2104-D, revision 01, Jan. 28, 2009.

SAS Protocol, "Information Technology—Serial Attached SCSI—2 (SAS-2)", INCITS document T10/1760-D, revision 15a, Feb. 22, 2009.

US 7,161,836, 01/2007, Wan et al. (withdrawn)

* cited by examiner

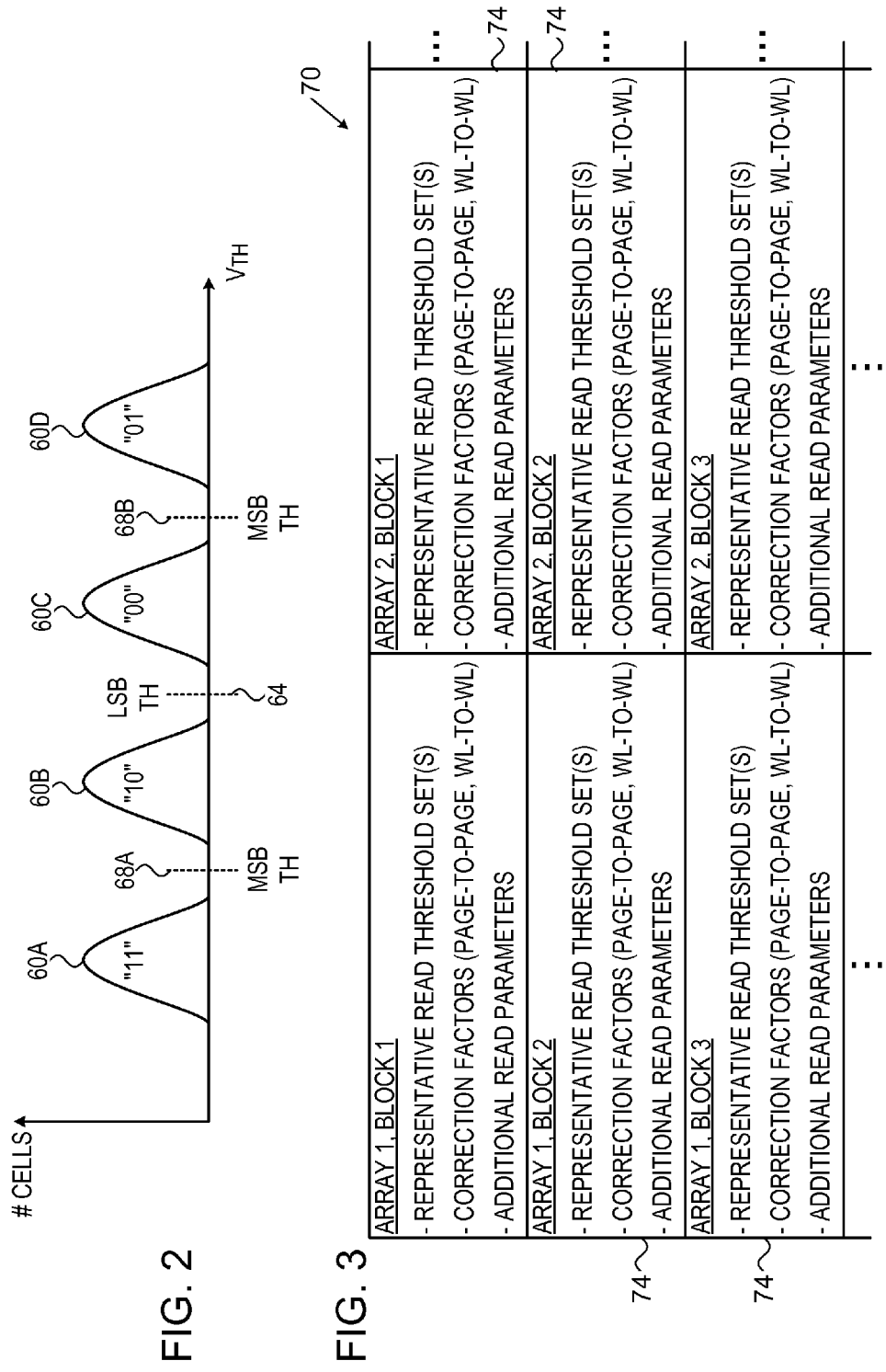

DATABASE OF MEMORY READ THRESHOLDS

CROSS-REFERENCE TO RELATED APPLICATIONS

This application claims the benefit of U.S. Provisional Patent Application 61/163,138, filed Mar. 25, 2009, whose disclosure is incorporated herein by reference. This application also claims the benefit of U.S. Provisional Patent Application 61/234,695, filed Aug. 18, 2009.

FIELD OF THE INVENTION

The present invention relates generally to memory devices, and particularly to storing and using memory readout parameters.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Data readout from analog memory cells typically involves comparing the cells' storage values to certain read thresholds. Several methods for managing read thresholds are known in the art. For example, U.S. Patent Application Publication 2007/0091677, whose disclosure is incorporated herein by reference, describes techniques for reading data from Flash memory cells and for recovering from read errors. In some embodiments, in the event of an error correction failure by an error detection and correction module, the Flash memory cells are re-read at least once using one or more modified reference voltages, for example, until a successful error correction may be carried out. In some embodiments, reference voltages associated with a reading where errors are corrected may be stored in memory, and retrieved when responding to a subsequent read request.

PCT International Publication WO 2009/072102, whose disclosure is incorporated herein by reference, describes a method for reading at least one page within an erase sector of a Flash memory device. The method computes at least one mock reading threshold. The mock reading threshold is used to perform at least one mock read operation of at least a portion of at least one page within the erase sector, thereby generating a plurality of logical values. A set of reading thresholds based at least partly on the plurality of logical values is defined, and at least one page is read using the set of reading thresholds.

SUMMARY OF THE INVENTION

An embodiment of the present invention provides a method for data storage, including:

storing multiple sets each including one or more read thresholds for use in reading data from a plurality of analog memory cells, which are arranged in multiple erasure blocks each including multiple pages, such that each set of read thresholds is associated with a respective page in one of the erasure blocks; and reading a first page, which belongs to a given erasure block and is not associated with any of the stored sets of read thresholds, by:

retrieving a stored set of read thresholds that is associated with a second page in the given erasure block;

adapting the retrieved set of read thresholds to match the first page; and reading the first page using the adapted set of read thresholds.

In some embodiments, the first page is located in a first row of the given erasure block, the second page is located in a second row of the given erasure block, different from the first row, and adapting the retrieved set of read thresholds includes adjusting at least one of the read thresholds in the retrieved set as a function of the first and second rows. In another embodiment, each of the analog memory cells stores two or more respective bits, the first page is stored in respective first bits of a given group of the analog memory cells, the second page is stored in respective second bits of the given group, and adapting the retrieved set of read thresholds includes setting the read thresholds for reading the first page as a function of at least one of the read thresholds in the retrieved set.

In a disclosed embodiment, storing the sets includes selecting an erasure block irrespective of accepting any read command from a host, performing a read operation that reads at least a given page from the selected erasure block, and storing a set of read thresholds that was successful in reading the given page. Automatically selecting the erasure block may include running a background task that periodically selects the erasure block.

In an embodiment, the method includes storing at least one read parameter pertaining to the given erasure block, and adapting the retrieved set of read thresholds includes retrieving the read parameter and adjusting at least one of the read thresholds in the retrieved set based on the retrieved read parameter. In some embodiments, the at least one read parameter includes a number of programming and erasure cycles applied to the given erasure block, a time that elapsed since a last programming operation applied to the given erasure block, a time-temperature integral estimated for the given erasure block, and/or an index of a last page written to the given erasure block. In some embodiments, the at least one read parameter includes a first temperature of the analog memory cells at a first time at which the given erasure block was programmed, and adjusting the read thresholds includes modifying the read thresholds based on a difference between the first temperature and a second temperature of the analog memory cells at a second time at which the given erasure block is read.

In some embodiments, the method includes updating the stored sets with the adapted set of read thresholds upon successfully reading the first page. In an embodiment, storing the sets includes storing no more than a single respective set of read thresholds for each erasure block. In another embodiment, reading the first page includes accepting a read command from a host system, reading the first page in response to the read command, and sending the read first page to the host system. In yet another embodiment, storing the sets includes storing the sets in a memory of the host system. In still another embodiment, the multiple sets are drawn from a predefined list of sets, and storing the sets includes storing respective indices of the sets in the list.

In a disclosed embodiment, the multiple sets are stored in a volatile memory, the analog memory cells include non-volatile memory cells, and the method includes copying the multiple sets to the analog memory cells in response to an imminent disruption of electrical power, and recovering the multiple sets from the analog memory cells to the volatile memory following reapplication of the electrical power.

In some embodiments, storing the multiple sets includes storing an indication of a successful readout scheme that previously succeeded in reading at least one page of the given erasure block, and reading the first page includes retrieving the indication and reading the first page using the respective successful readout scheme. The successful readout scheme may specify an Error Correction Code (ECC) decoding scheme that succeeded in decoding the at least one page, a number of re-read operations that succeeded in reading the at least one page, and/or a notification of whether interference cancellation was used in order to successfully read the at least one page.

In an embodiment, the indication is indicative of a number of errors that were encountered in the given erasure block. In a disclosed embodiment, reading the first page includes selecting a readout scheme for reading the first page responsively to the stored set of read thresholds. In another embodiment, the method includes assessing a quality of the given erasure block based on the stored set that is associated with the given erasure block. In an alternative embodiment, the method includes storing a quality of the given erasure block in the stored set that is associated with the given erasure block.

There is additionally provided, in accordance with an embodiment of the present invention, apparatus for data storage, including:

a threshold memory; and a processor, which is configured to store in the threshold memory multiple sets each including one or more read thresholds for use in reading data from a plurality of analog memory cells, which are arranged in multiple erasure blocks each including multiple pages, such that each set of read thresholds is associated with a respective page in one of the erasure blocks, to read a first page, which belongs to a given erasure block and is not associated with any of the sets of read thresholds stored in the threshold memory, by retrieving from the threshold memory a stored set of read thresholds that is associated with a second page in the given erasure block, adapting the retrieved set of read thresholds to match the first page, and reading the first page using the adapted set of read thresholds.

There is also provided, in accordance with an embodiment of the present invention, apparatus for data storage, including:

a non-volatile memory, which includes a plurality of analog memory cells that are arranged in multiple erasure blocks each including multiple pages;

a threshold memory; and a processor, which is configured to store multiple sets each including one or more read thresholds for use in reading data from the analog memory cells, such that each set of read thresholds is associated with a respective page in one of the erasure blocks, to read a first page, which belongs to a given erasure block and is not associated with any of the sets of read thresholds stored in the threshold memory, by retrieving from the threshold memory a stored set of read thresholds that is associated with a second page in the given erasure block, adapting the retrieved set of read thresholds to match the first page, and reading the first page using the adapted set of read thresholds.

The present invention will be more fully understood from the following detailed description of the embodiments thereof, taken together with the drawings in which:

BRIEF DESCRIPTION OF THE DRAWINGS

FIG. 2 is a graph showing threshold voltage distributions and associated read thresholds in a group of analog memory cells, in accordance with an embodiment of the present invention;

FIG. 3 is a diagram showing a read threshold database, in accordance with an embodiment of the present invention.

DETAILED DESCRIPTION OF EMBODIMENTS

Overview

Figure 1:
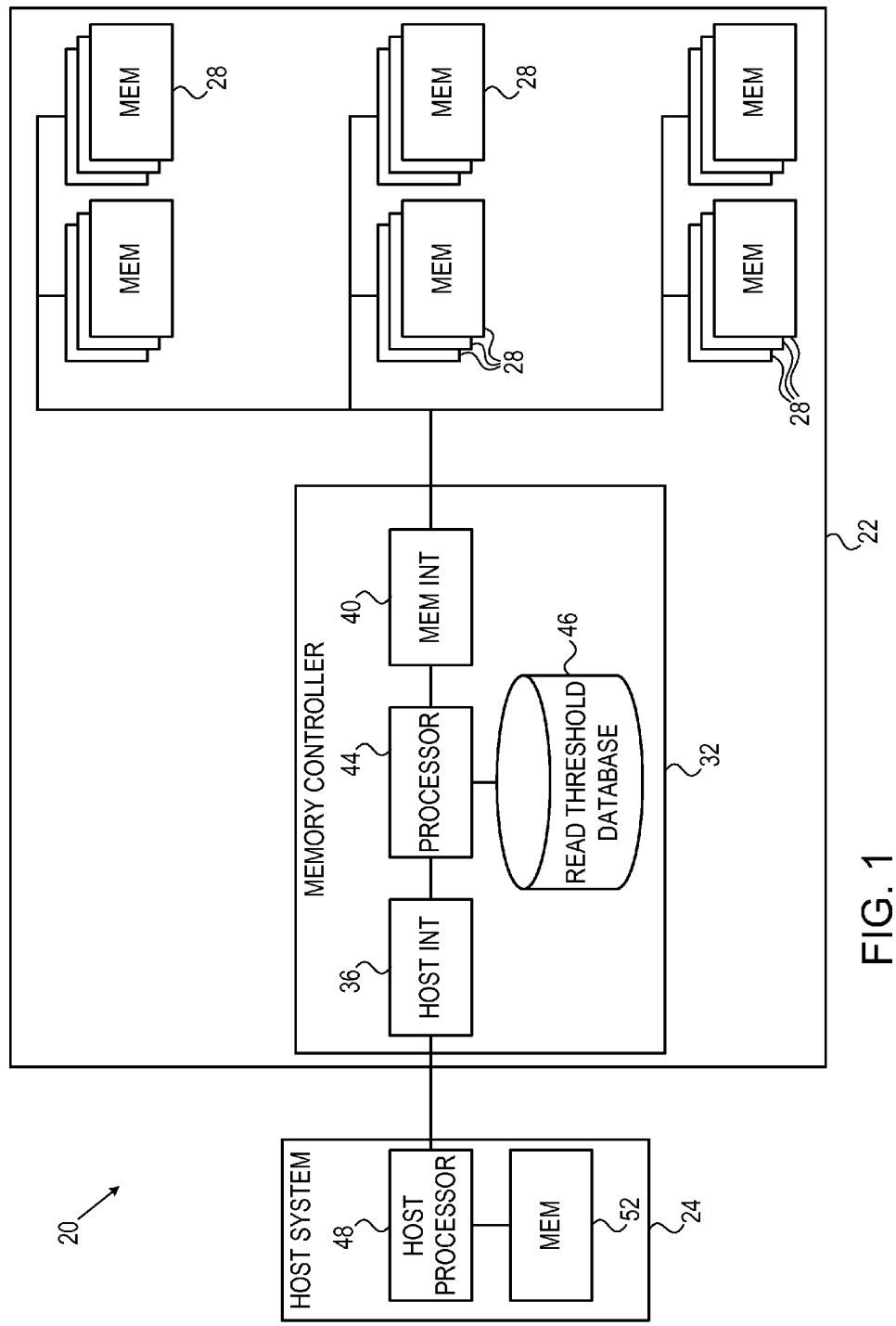
FIG. 1 is a block diagram that schematically illustrates a data storage system, in accordance with an embodiment of the present invention.

Analog memory cells are typically read by comparing the memory cells' analog values (e.g., threshold voltages) to one or more read thresholds. In most cases, a readout operation of this sort is applied to an entire memory page, i.e., a data unit that is stored in a given group of memory cells and is read and written simultaneously. The read thresholds are usually positioned between adjacent analog value regions that correspond to different programming states, so as to achieve low error probability. In many practical cases, however, the distribution of analog values varies from one page to another. As a result, the optimal read threshold values often differ from page to page.

Embodiments of the present invention provide improved methods and systems for managing and using read thresholds. In some embodiments, a memory controller stores data in a memory comprising multiple analog memory cells. The analog memory cells are arranged in erasure blocks, each erasure block comprising multiple pages. The memory controller maintains a read threshold database, which holds multiple sets of read thresholds. Each set of read thresholds is associated with a respective page in one of the erasure blocks. Typically, each set of read thresholds is stored in the database after having proven successful in reading the respective page.

When intending to read a certain page, the memory controller attempts to find a set of read thresholds that is associated with that page in the database. If a matching set of read thresholds is found, the memory controller reads the page using this set. Otherwise, the memory controller retrieves from the database a set of read thresholds that is associated with another page in the same erasure block. The memory controller adapts the retrieved set of read thresholds so as to match the page to be read, and then reads the page using the adapted set of read thresholds. In many cases, the retrieved set of read thresholds will perform well as-is in reading the page in question, even though the thresholds originated from another page. In other cases, some additional adaptation will still be needed to achieve successful readout. In either case, initiating the readout process with read thresholds that performed well in another page of the same block provides considerable reduction in the overall readout time, since it reduces the trial-and-error that might otherwise be required in order to find the correct read thresholds to use for each page.

Several methods for adjusting read thresholds that are associated with one page to match another page are described herein. For example, the variation of read thresholds between different rows in the erasure block may be known. Some of the disclosed methods use this information to determine the appropriate adjustment. In some Multi-Level Cell (MLC) memory devices, a group of memory cells stores two or more pages. Some disclosed methods adjust the read thresholds of a given page based on the read thresholds of a different page stored in the same group of memory cells. Additionally or alternatively, the memory controller may adjust the read thresholds based on the estimated endurance and/or retention period of the page to be read. In some embodiments, the memory controller continually refreshes and enriches the read threshold database, such as by running a background task that performs page read operations and updates the database with the successful read thresholds.

The methods and systems described herein estimate the read thresholds for a given page based on other read thresholds that performed well on another page in the same erasure block. This feature provides a kind of data compression, in that it enables the memory controller to compute read thresholds for any desired page in a given erasure block while physically storing read thresholds for only a small number of pages in the block. As a result, the memory controller can perform read operations with high speed and reliability using only modest-size data structures.

System Description

FIG. 1 is a block diagram that schematically illustrates a data storage system 20, in accordance with an embodiment of the present invention. System 20 comprises a memory system 22 and a host system 24. Memory system 22 accepts data for storage from host system 24 and stores it in memory, and retrieves data from memory and provides it to the host system. In the present example, system 22 comprises a Solid-State Disk (SSD) that stores data for a host computer. In alternative embodiments, however, system 22 may be used in any other suitable application and with any other suitable host system, such as in computing devices, cellular phones, WiFi terminals or other communication terminals, Global Positioning System (GPS) units, removable memory modules such as Disk-On-Key (DOK) devices, Secure Digital (SD) cards, Multi-Media Cards (MMC) and embedded MMC (eMMC), digital cameras, music and other media players such as Portable Media Players (PMP), and/or any other system or device in which data is stored and retrieved.

Memory system 22 comprises multiple memory devices 28, each comprising multiple analog memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells, can also be used.

In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 22 stores data in the analog memory cells by programming the memory cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Typically, each memory device comprises multiple erasure blocks (also referred to as memory blocks, or simply blocks for brevity), i.e., groups of memory cells that are erased together. The memory cells in each erasure block are typically arranged in rows and columns. Each column is connected to a respective bit line, and each row is connected to a respective Word Line (WL). Each row (word line) in a given block typically stores one or more memory pages. Within a given row, different pages may be stored in different memory cells, e.g., one page in even-order cells and another cell in odd-order cells. Additionally or alternatively, when using MLC, different pages can be stored in different MLC bits of the same group of memory cells.

Each memory device 28 may comprise a packaged device or an unpackaged semiconductor chip or die. A typical SSD may comprise a number of 4 GB devices. Generally, however, memory system 22 may comprise any suitable number of memory devices of any desired type and size. Although the system configuration of FIG. 1 comprises multiple memory devices, some of the methods and systems described herein can also be used in systems having only a single memory device.

Memory system 22 comprises a memory controller 32, which accepts data from host system 24 and stores it in memory devices 28, and retrieves data from the memory devices and provides it to the host system. Memory controller 32 comprises a host interface 36 for communicating with host system 24, a memory interface 40 for communicating with memory devices 28, and a processor 44 that processes the stored and retrieved data. For example, processor 44 may encode the data for storage with an Error Correction Code (ECC) and decode the ECC of data read from memory. The functions of processor 44 can be implemented, for example, using software running on a suitable Central Processing Unit (CPU), using hardware (e.g., state machine or other logic), or using a combination of software and hardware elements.

In some embodiments, memory controller 32 comprises a read threshold database 46, also referred to as a threshold memory, which holds read threshold values that proved successful in reading data from respective pages. Database 46 may be stored in an internal memory of controller 32, in an external volatile or non-volatile memory device, or in any other suitable memory. Memory controller reads data from memory devices 28 by processing the read thresholds stored in database 46, using methods that are described in detail below. In some embodiments, database 46 holds additional information that is used by controller 32 in the readout process.

Host system 24 comprises a host processor 48 and a memory 52, e.g., a Dynamic Random Access Memory (DRAM). In some embodiments, database 46 is stored in memory 52 of the host system. In these embodiments, memory controller 32 may access database 46 by communicating with host processor 48, or using a dedicated interface with memory 52.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The system configuration of FIG. 1 is an example configuration, which is shown purely for the sake of conceptual clarity. Any other suitable memory system configuration can also be used. For example, in some embodiments two or more memory controllers 32 may be connected to the same host processor. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by host processor 48 or other element of host system 24, or by any other type of memory controller. In some embodiments, host processor 48 and Memory controller 32 may be fabricated on the same die, or on separate dies in the same device package.

FIG. 2 is a graph showing threshold voltage distributions and associated read thresholds in a group of analog memory cells, in accordance with an embodiment of the present invention. The example of FIG. 2 refers to a group of four-level MLC, each storing two data bits. Four programming levels 60A . . . 60D represent the bit value combinations "11", "10", "00" and "01", respectively. As can be seen in the figure, the threshold voltages of the memory cells in each programming level have a certain statistical distribution.

In the present example, the group of memory cells holds two memory pages, referred to as a Least Significant Bit (LSB) page and a Most Significant Bit (MSB) page. The LSB page is stored in the LSBs of the memory cells (the left-hand-side bits in the notation used in FIG. 2), and the MSB page is stored in the MSBs of the memory cells (the right-hand-side bits in the notation used in the figure). In order to read the data from this group of memory cells, the memory controller compares the cells' threshold voltages to three read thresholds. The LSB page is read by comparing the cells' threshold voltages to an LSB threshold 64. The MSB page is read by comparing the cells' threshold voltages to two MSB thresholds 68A and 68B. Although the example of FIG. 2 refers to four-level memory cells that store two pages, the techniques described herein can be used with any other type of memory cells, such as Single-Level Cells (SLC) that store a single page, eight-level MLC that store three pages, or any other suitable configuration.

Memory Readout Using Read Threshold Database

The example of FIG. 2 above demonstrates the threshold voltage distribution in a certain group of memory cells. In practice, the threshold voltage distributions often differ from one group of memory cells to another within the same erasure block. Different memory cells groups may have threshold voltage distributions that differ in mean, variance or any other property. The differences may be caused, for example, by manufacturing process variations, interference from neighboring cells, retention or endurance effects, or for any other reason. Consequently, the optimal positions of the read thresholds may differ from one cell group to another, as well.

When reading data from a given page, it is advantageous to initially attempt a set of read thresholds that is at or near the optimal positions for that page. When using read thresholds that are optimal or nearly optimal, readout is likely to succeed with high probability. Even if the initial attempt fails, minor adjustment of the read thresholds is likely to achieve successful readout. If, on the other hand, initial readout is attempted using read thresholds that are far from the optimal positions, multiple adaptation iterations may be needed.

The process of adapting read thresholds starting from unknown or considerably non-optimal initial values is sometimes referred to as "acquisition." The process of adapting read thresholds from values that are near the optimal positions is sometimes referred to as "tracking." Example techniques for read threshold tracking and acquisition are described in PCT International Publications WO 2007/132457, WO 2008/053472 and WO 2008/111058, whose disclosures are incorporated herein by reference.

As can be appreciated, initiating the readout process with optimal or nearly optimal read thresholds increases the likelihood of success without reverting to acquisition. Even in cases where acquisition is still required, the length and complexity of the acquisition process is considerably reduced. In summary, the ability to begin the readout process with nearly optimal read thresholds shortens the overall readout time significantly. The performance improvement is particularly significant in random read operations (readout of relatively short data items from sporadic page addresses), although it is useful in sequential read operations (readout of large data items stored in sequential page addresses), as well.

In some embodiments, memory controller 32 stores multiple sets of read thresholds, which have proven to perform well, in read threshold database 46. The memory controller uses the stored sets of read thresholds when attempting to read data from memory devices 28. Each set of read thresholds may comprise one or more thresholds. For example, a set of read thresholds for an SLC device (or a set of read thresholds for a LSB page in a MLC device) typically comprises a single threshold. A set of read thresholds for an MSB page in a four-level (2 bits/cell) device typically comprises two thresholds (e.g., thresholds 68A and 68B in FIG. 2). Each set of read thresholds in database 46 is associated with a specific page in a specific erasure block in one of memory devices 28. Typically, the set of read thresholds associated with a given page is a set that succeeded in reading that page without errors.

When preparing to read a given page, e.g., in response to a read command from the host system, memory controller 32 tries to find a set of read thresholds that is associated with the requested page in database 46. If a matching set is found in the database, the memory controller reads the page using that set. Otherwise, the memory controller retrieves a set of read thresholds that is associated with another page in the same erasure block, and adapts this set to match the requested page. The memory controller then reads the requested page using the adapted set of read thresholds. In some cases, the adaptation process adjusts one or more of the thresholds in the retrieved set in order to match the requested page. In other cases, the retrieved set of thresholds matches the requested page as-is, even though it originates from another page in the erasure block. In this case, the adaptation process does not adjust any of the thresholds. In the present context, the term "adapting the thresholds" means verifying that the set of read thresholds matches the requested page, and possibly adjusting one or more of the thresholds for this purpose.

Memory controller 32 may use any suitable technique for adapting the retrieved set of read thresholds to match the page to be read. For example, in some cases the variation of the read thresholds between different rows (Word Lines—WLs) in the erasure block is known in advance. The memory controller may use this known relationship to produce read thresholds that are suitable for a given WL from a set of read threshold that was successful in another WL in the same block. For example, if the optimal read thresholds for WL #23 are stored in database 46 from a previous successful read operation, these thresholds can be adapted to produce read thresholds for reading WL #95 in the same erasure block.

In an example embodiment, the memory controller calculates a correction factor as a function of the WL index of the retrieved threshold set and the WL index of the page to be read. The memory controller then applies this correction to the retrieved threshold set, so as to produce a set of read thresholds that matches the page to be read. In alternative embodiments, the memory controller may calculate and apply more than one correction factor, e.g., apply different correction factors to different thresholds in the set.

Any known relationship between WLs can be used by the memory controller. For example, the optimal read threshold positions may vary from one WL to the next at a known rate or according to a known function (e.g., a linear or polynomial function). As another example, the optimal read threshold positions of certain WLs (e.g., the first and/or last WLs in the block) may have a known offset with respect to other WLs. In some embodiments, the WL-to-WL relationship and/or correction factors is stored in database 46. In these embodiments, memory controller 32 retrieves this relationship from the database, and applies it to the retrieved set of read thresholds. The relationships between WLs can be characterized or calibrated during production and/or during normal operation of system 20. In some embodiments, one or more of these relationships can be adaptive, i.e., adjusted automatically by the memory controller. The characterization or calibration may be performed for each individual memory device, or over a collection of memory devices.

As another example, the memory controller may use the read thresholds of a given page to adapt the read thresholds of another page that is stored in the same group of memory cells. As explained above, a given group of memory cells (e.g., a WL) in an MLC device can store two or more pages in different bits (e.g., one page in the cell LSBs and another page in the cell MSBs, as in the example of FIG. 2). In practice, the variation of the optimal read threshold positions is often correlative between the thresholds of different pages in the same group of memory cells. With reference to FIG. 2, for example, the optimal position of LSB threshold 64 is often indicative of the optimal positions of MSB thresholds 68A and 68B, and vice versa. Similar correlations often exist between pages of other kinds of MLC, e.g., three or four bits/cell devices.

In some embodiments, the memory controller finds in database 46 a set of read thresholds that is associated with another page in the same cell group as the page to be read. The memory controller then adapts the retrieved thresholds to produce a set of read thresholds for reading the requested page. Any suitable relationship or correction factor can be used. For example, the memory controller may set the thresholds of the page to be read at known fixed offsets with respect to the read thresholds of the retrieved page. In some embodiments, page-to-page offsets or other correction factors are stored in database 46, and the memory controller retrieves and applies these correction factors. The relationships between pages can be estimated by characterization or calibration, during production and/or during normal system operation. In some embodiments, one or more of these relationships can be adaptive, i.e., adjusted automatically by the memory controller.

In some embodiments, multiple pages can be stored in different cell groups in the same WL. For example, one page can be stored in the even-order memory cells of the WL, and another page in the odd-order memory cells. The read thresholds of these pages may be correlated, and the memory controller may use this correlation. In an example embodiment, the memory controller finds in database 46 a set of read thresholds that is associated with another page in the same WL as the page to be read, although in different memory cells. The memory controller adapts the retrieved thresholds to produce a set of read thresholds for reading the requested page. In an example embodiment, even-order memory cells in a given WL suffer from horizontal cross-coupling interference caused by the odd-order memory cells of that WL. The odd-order memory cells, on the other hand, do not suffer from horizontal cross-coupling interference. Thus, the read thresholds for reading the even-order memory cells are expected to be higher than those of the odd-order memory cells. The memory controller may use this fact to deduce the read thresholds for the odd-order memory cells from the read thresholds of the even-order memory cells, or vice versa.

In some embodiments, memory controller 32 stores in database 46 additional parameters, which assist in adapting the read thresholds of the page to be read. For example, the memory controller may store parameters such as the number of Programming and Erasure (P/E) cycles that each block has gone through, the time that elapsed since the last write operation to each block (retention time), and/or the index of the last page that was written to each block. As another example, the memory controller may estimate and store a time-temperature integral of each block, i.e., an integral of the operating temperature of the block over time. (The memory controller may store and use the time that elapsed since the last write operation, for example, if temperature measurements of the memory device are not available.) Any of these read parameters can be indicative of the adaptation to be applied to a set of read thresholds retrieved from database 46 when preparing to read a page from the same block.

As yet another example, the read threshold adjustment may depend on the difference between the temperature of the memory device at programming time and the temperature at reading time. In some embodiments, the memory controller stores in database 46 the temperature of the memory device when a given block was programmed. When reading data from this block, the memory controller reads the programming-time temperature from database 46, compares it with the current temperature (reading-time temperature), and adjusts the read thresholds based on the difference between the two temperatures. Additionally or alternatively, the memory controller may store in database 46 any other suitable read parameter.

In some embodiments, when memory controller 32 intends to read a given page from a given block, it retrieves a set of read thresholds that proved successful in reading a certain page in this block. In addition, the memory controller retrieves one or more read parameters pertaining to this block. The memory controller adapts the retrieved threshold set based on the retrieved read parameters, and reads the requested page using the adapted thresholds. Note that adapting read thresholds using read parameters is advantageous regardless of whether the retrieved threshold set is associated with the requested page or with another page in the block.

In an example embodiment, when the memory controller prepares to read a page from a given block, it retrieves (1) a set of read thresholds associated with this block, and (2) the time that elapsed since the last write operation to this block (retention time). The memory controller adapts the retrieved read thresholds based on the retrieved retention time, and reads the page using the adapted read thresholds. In an embodiment, assuming readout is successful, the memory controller updates database 46 with the newly adapted read thresholds, and re-initializes the stored retention time.

FIG. 3 is a diagram showing an example data structure 70, which can be used to implement threshold database 46, in accordance with an embodiment of the present invention. Memory system 22 is assumed to comprise multiple memory arrays (e.g., memory dies, planes or devices), with each array comprising multiple erasure blocks. In the present example, database 46 comprises a respective entry 74 for each erasure block.

Each database entry comprises a representative set of read thresholds, which has proven successful in reading a certain page in this block. In addition, each entry 74 may comprise WL-to-WL and/or page-to-page correction factors, which are used by the memory controller as explained above. Additionally or alternatively, each database entry 74 comprises one or more read parameters. In the present example, database 46 contains no more than a single set of read thresholds for each erasure block. Some erasure blocks (e.g., blocks from which no data was read yet) may have no valid entries in the database.

The threshold database configuration of FIG. 3 is an example configuration, which is shown purely for the sake of conceptual clarity. In alternative embodiments, any other suitable configuration can also be used. For example, the database entry of a given block may comprise more than a single set of read thresholds, e.g., two or more sets of read thresholds that are associated with respective pages or groups of pages in the block. Additionally or alternatively, the database entry of a given block may comprise multiple sets of correction factors and/or read parameters, e.g., sets corresponding to different pages or groups of pages in the block.

In some embodiments, the sets of read thresholds in database 46 are drawn from a finite predefined list of threshold sets. In these embodiments, the memory controller may store in database 46 only the indices of the threshold sets, rather than the actual threshold values. In other words, the database entry of a given block in database 46 may comprise the indices of the threshold sets in the list, rather than the threshold values. This representation further reduces the database size.

Figure 4:
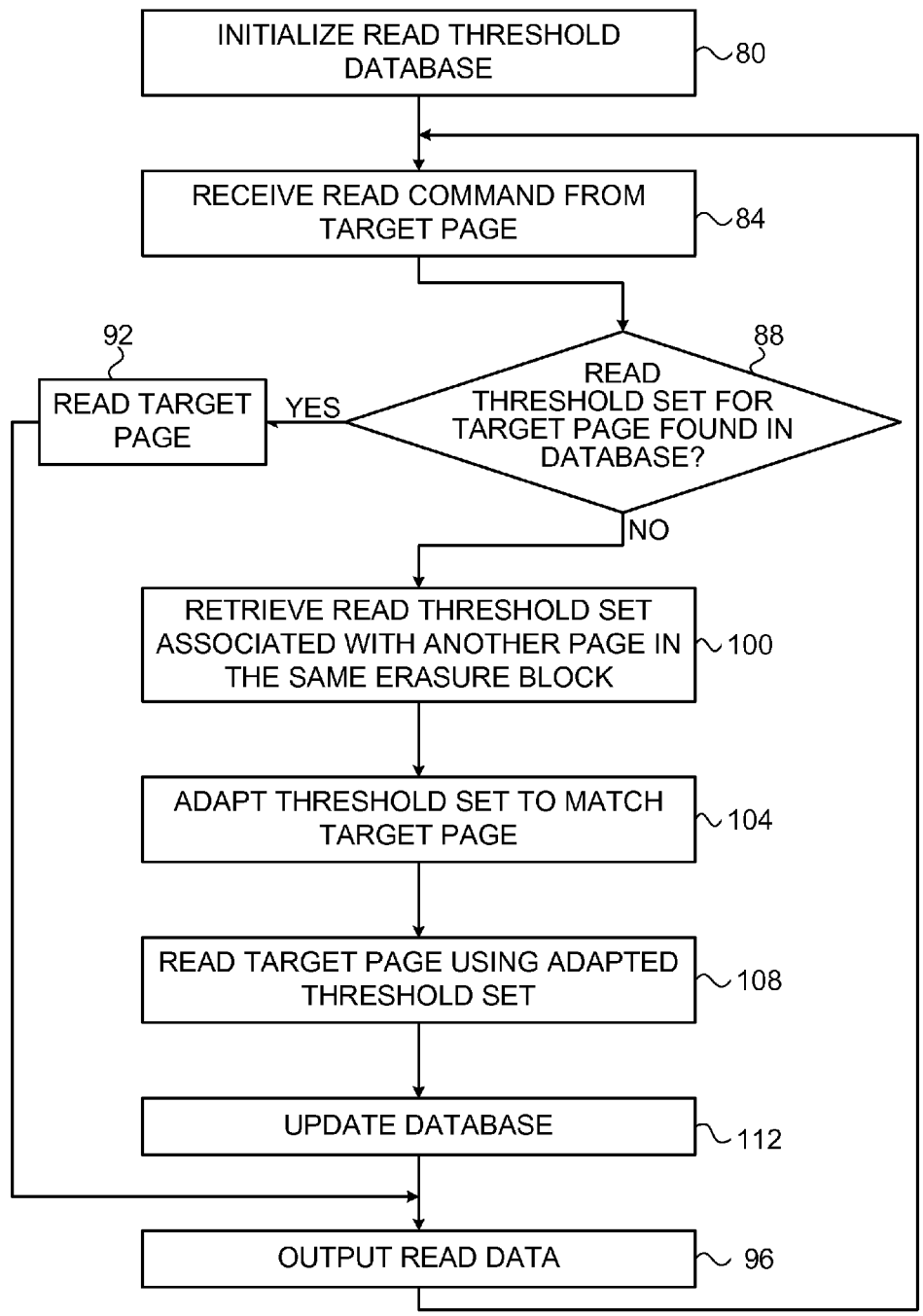
FIG. 4 is a flow chart that schematically illustrates a method for managing and using read thresholds, in accordance with an embodiment of the present invention.

FIG. 4 is a flow chart that schematically illustrates a method for managing and using read thresholds, in accordance with an embodiment of the present invention. The method begins with memory controller 32 initializing threshold database 46, at an initialization step 80. In some embodiments, the database is initially empty before any successful readout operations are performed. In alternative embodiments, the memory controller may initialize the database with certain default read threshold values. The correction factors and read parameters are initialized to their appropriate initial values, as well.

The memory controller receives from host system 24 a read command, at a command input step 84. The read command requests the memory controller to read a certain memory page, referred to below as a target page. The target page belongs to a certain erasure block in one of memory devices 28. (Typically, the read command does not specify the actual physical page to be read. The command typically requests readout of a certain data item, which may comprise multiple pages, from a specified logical address. Logical-to-physical address translation is typically performed by the memory controller.)

The memory controller attempts to find in database 46 a set of read thresholds that matches the target page, a match checking step 88. For example, the memory controller may locate a database entry 74 corresponding to the block of the target page, and check whether this database entry contains a set of read thresholds associated with the target page. If a matching set of thresholds is found, the memory controller reads the target page using this threshold set, at a match readout step 92. The memory controller sends the read data of the target page to the host system, at an output step 96. The method then loops back to step 84 above, where the memory controller is ready to receive a subsequent read command.

If, on the other hand, memory controller 32 is unable to find a set of read thresholds that is associated with the target page, the memory controller retrieves a set of read thresholds that is associated with another page in the same erasure block, at a retrieval step 100. The memory controller adapts the retrieved set of thresholds to match the target page, at an adaptation step 104. As explained above, adaptation may involve adjusting the values of one or more of the thresholds, or it may involve using the retrieved set of thresholds as-is. The memory controller may use any suitable adaptation scheme, such as the above-described schemes using correction factors and/or read parameters.

After adapting the retrieved read thresholds, the memory controller reads the target page using the adapted thresholds, at an adapted readout step 108. Assuming readout is successful, the memory controller updates database 46 with the adapted values of the read thresholds, at a database updating step 112. One or more of the read parameters may also be updated, as appropriate. The memory controller sends the read data of the target page to the host system, at step 96, and the method loops back to step 84 above.

In some embodiments, memory controller 32 refreshes database 46 automatically, by performing read operations irrespective of read commands from the host system. The automatic refresh operations may be performed to update existing database entries (i.e., to update the read thresholds of blocks that already exist in database 46), or to create new database entries of blocks that are not yet represented in the database.

For example, the memory controller may run a background task that periodically reads pages from certain erasure blocks, but does not necessarily decode or transfer the read data to the host system. The purpose of these read operations is to keep database 46 up-to-date with valid read threshold values, so that the database is more likely to contain threshold sets that match pages that are requested in host-initiated read commands. In an example embodiment, the background task reads a single representative page from each selected block, and updates database 46 with the read thresholds that were successful in reading this page. In an embodiment, the memory controller selects a page from which it is easy to predict the read thresholds of the other pages in the block. For example, a page in the middle of the block may be preferable for this purpose.

In some embodiments, the memory controller performs these database refresh operations during idle periods in which little or no memory access operations are requested by the host system. In some embodiments, the memory controller gives preference to refreshing of thresholds in erasure blocks that have not been read recently. Therefore, many of these read operations will typically involve threshold acquisition. The memory controller may use any suitable scheduling or selection criteria in order to select when and/or which blocks to refresh in threshold database 46.

As noted above, threshold database 46 is typically stored in volatile memory. In these embodiments, the threshold database may be lost if the electrical power of system 22 is disrupted. For example, when system 22 comprises an SSD installed in a host computer, the host computer may go into hibernation, in which case the SSD power supply is disrupted. In some embodiments, memory controller 32 prevents this information loss by copying the content of database 46 to non-volatile memory devices 28 when electrical power disruption is imminent. When power is reapplied, the memory controller retrieves the database content from the non-volatile memory devices and recovers database 46. In alternative embodiments, database 46 is erased at power-down and re-built after power-up. In the latter case, read operations during the initial period after power-up may be slower, since they will typically involve threshold acquisition.

In some embodiments, processor 44 is able to read pages from memory devices 28 using several different readout schemes. Different readout schemes typically provide different trade-offs between robustness, latency, power consumption or other performance figures. When preparing to read a given page from a given block, processor 44 selects one of the readout schemes, and reads the page using the selected scheme.

For example, the readout scheme may specify an ECC decoding scheme to be used in decoding the ECC of the page. In an example embodiment, one decoding scheme may comprise a hard decoding scheme, while another decoding scheme may comprise a soft decoding scheme. As another example, processor 44 may select between two or more soft decoding schemes that differ from one another in the quantization level of the soft metrics on which they operate.

Additionally or alternatively, the readout scheme may specify whether or not to re-read the page one or more times, either with different read thresholds or with the same read thresholds, in order to refine the readout resolution. The readout scheme may specify the number of re-read operations to be applied. Further additionally or alternatively, the readout scheme may specify whether or not to perform an interference cancellation process when reading the page. The interference cancellation process typically involves reading one or more neighboring pages and canceling the interference they cause. Further additionally or alternatively, each readout scheme may specify any other suitable attribute or property of the readout process.

In some embodiments, processor 44 stores in database indications of readout schemes that were proven successful in reading pages from memory devices 28. For each erasure block, processor 44 stores indications of one or more readout schemes, which were used successfully in reading pages from that block. When preparing to read a given page from a given block, processor 44 retrieves the readout scheme indications pertaining to that block from database 46, and reads the given page using one of these schemes. In some embodiments, processor 44 stores an indication of a single readout scheme per block. In alternative embodiments, processor 44 stores indications of multiple readout schemes per block, and selects one of the schemes using a suitable selection criterion.

When using the above-described technique, processor initially attempts to read a given page using a readout scheme that was previously successful in the same block. This initial selection increases the likelihood that the initial readout attempt will succeed. Even if the initial attempt fails, the correct readout scheme can be found in a small number of attempts. As a result, readout time can be reduced considerably.

Processor 44 may store in database 46 any suitable indication, which enables the processor to select the appropriate scheme. In some embodiments, the processor stores respective indices or other identifiers of the readout schemes. In alternative embodiments, the processor stores attributes of the block that enable choosing the appropriate readout scheme.

For example, the processor may store, for each erasure block, the average or maximum number of errors per block (or per page) that were encountered in that block. When preparing to read a given page from a given block, the processor retrieves the number of errors pertaining to that block. If the number of errors is relatively small, the processor may choose a modest-robustness readout scheme that is typically fast and power-efficient. If the number of errors is relatively large, the processor may choose a more robust readout scheme, at the possible expense of higher latency or power consumption.

In an alternative embodiment, processor 44 can determine the appropriate readout scheme from the set of read thresholds that are associated with the block, without explicitly storing indications of previously-successful readout schemes.

In some embodiments, processor 44 can estimate the quality of a given erasure block based on the information pertaining to that block in database 46. The block quality can be estimated, for example, based on the readout scheme indications, and/or based on the read threshold values associated with the block. In an embodiment, processor 44 may store a quality indication for each erasure block in database 46.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
    storing multiple sets each comprising one or more read thresholds for use in reading data from a plurality of analog memory cells, which are arranged in multiple erasure blocks each comprising multiple pages, such that each set of read thresholds is associated with a respective page in one of the erasure blocks; and
    reading a first page, which belongs to a given erasure block and is not associated with any of the stored sets of read thresholds, by:
        retrieving a stored set of read thresholds that is associated with a second page in the given erasure block;
        adapting the retrieved set of read thresholds to match the first page; and
        reading the first page using the adapted set of read thresholds.

2. The method according to claim 1, wherein the first page is located in a first row of the given erasure block, wherein the second page is located in a second row of the given erasure block, different from the first row, and wherein adapting the retrieved set of read thresholds comprises adjusting at least one of the read thresholds in the retrieved set as a function of the first and second rows.

3. The method according to claim 1, wherein each of the analog memory cells stores two or more respective bits, wherein the first page is stored in respective first bits of a given group of the analog memory cells, wherein the second page is stored in respective second bits of the given group, and wherein adapting the retrieved set of read thresholds comprises setting the read thresholds for reading the first page as a function of at least one of the read thresholds in the retrieved set.

4. The method according to claim 1, wherein storing the sets comprises selecting an erasure block irrespective of accepting any read command from a host, performing a read operation that reads at least a given page from the selected erasure block, and storing a set of read thresholds that was successful in reading the given page.

5. The method according to claim 4, wherein automatically selecting the erasure block comprises running a background task that periodically selects the erasure block.

6. The method according to claim 1, and comprising storing at least one read parameter pertaining to the given erasure block, wherein adapting the retrieved set of read thresholds comprises retrieving the read parameter and adjusting at least one of the read thresholds in the retrieved set based on the retrieved read parameter.

7. The method according to claim 6, wherein the at least one read parameter comprises at least one parameter type selected from a group of types consisting of a number of programming and erasure cycles applied to the given erasure block, a time that elapsed since a last programming operation applied to the given erasure block, a time-temperature integral estimated for the given erasure block, and an index of a last page written to the given erasure block.

8. The method according to claim 6, wherein the at least one read parameter comprises a first temperature of the analog memory cells at a first time at which the given erasure block was programmed, and wherein adjusting the read thresholds comprises modifying the read thresholds based on a difference between the first temperature and a second temperature of the analog memory cells at a second time at which the given erasure block is read.

9. The method according to claim 1, and comprising, upon successfully reading the first page, updating the stored sets with the adapted set of read thresholds.

10. The method according to claim 1, wherein storing the sets comprises storing no more than a single respective set of read thresholds for each erasure block.

11. The method according to claim 1, wherein reading the first page comprises accepting a read command from a host system, reading the first page in response to the read command, and sending the read first page to the host system.

12. The method according to claim 11, wherein storing the sets comprises storing the sets in a memory of the host system.

13. The method according to claim 1, wherein the multiple sets are drawn from a predefined list of sets, and wherein storing the sets comprises storing respective indices of the sets in the list.

14. The method according to claim 1, wherein the multiple sets are stored in a volatile memory, wherein the analog memory cells comprise non-volatile memory cells, and comprising copying the multiple sets to the analog memory cells in response to an imminent disruption of electrical power, and recovering the multiple sets from the analog memory cells to the volatile memory following reapplication of the electrical power.

15. The method according to claim 1, wherein storing the multiple sets comprises storing an indication of a successful readout scheme that previously succeeded in reading at least one page of the given erasure block, and wherein reading the first page comprises retrieving the indication and reading the first page using the respective successful readout scheme.

16. The method according to claim 15, wherein the successful readout scheme specifies at least one item selected from a group of items consisting of:
    an Error Correction Code (ECC) decoding scheme that succeeded in decoding the at least one page;
    a number of re-read operations that succeeded in reading the at least one page; and
    a notification of whether interference cancellation was used in order to successfully read the at least one page.

17. The method according to claim 15, wherein the indication is indicative of a number of errors that were encountered in the given erasure block.

18. The method according to claim 1, wherein reading the first page comprises selecting a readout scheme for reading the first page responsively to the stored set of read thresholds.

19. The method according to claim 1, and comprising assessing a quality of the given erasure block based on the stored set that is associated with the given erasure block.

20. The method according to claim 1, and comprising storing a quality of the given erasure block in the stored set that is associated with the given erasure block.

21. Apparatus for data storage, comprising:
a threshold memory; and
a processor, which is configured to store in the threshold memory multiple sets each comprising one or more read thresholds for use in reading data from a plurality of analog memory cells, which are arranged in multiple erasure blocks each comprising multiple pages, such that each set of read thresholds is associated with a respective page in one of the erasure blocks, to read a first page, which belongs to a given erasure block and is not associated with any of the sets of read thresholds stored in the threshold memory, by retrieving from the threshold memory a stored set of read thresholds that is associated with a second page in the given erasure block, adapting the retrieved set of read thresholds to match the first page, and reading the first page using the adapted set of read thresholds.

22. The apparatus according to claim 21, wherein the first page is located in a first row of the given erasure block, wherein the second page is located in a second row of the given erasure block, different from the first row, and wherein the processor is configured to adjust at least one of the read thresholds in the retrieved set as a function of the first and second rows.

23. The apparatus according to claim 21, wherein each of the analog memory cells stores two or more respective bits, wherein the first page is stored in respective first bits of a given group of the analog memory cells, wherein the second page is stored in respective second bits of the given group, and wherein the processor is configured to set the read thresholds for reading the first page as a function of at least one of the read thresholds in the retrieved set.

24. The apparatus according to claim 21, wherein the processor is configured to select an erasure block irrespective of accepting any read command from a host, to perform a read operation that reads at least a given page from the selected erasure block, and to store a set of read thresholds that was successful in reading the given page.

25. The apparatus according to claim 24, wherein the processor is configured to run a background task that periodically selects the erasure block.

26. The apparatus according to claim 24, wherein the processor is configured to store in the threshold memory at least one read parameter pertaining to the given erasure block, to retrieve the read parameter and to adjust at least one of the read thresholds in the retrieved set based on the retrieved read parameter.

27. The apparatus according to claim 26, wherein the at least one read parameter comprises at least one parameter type selected from a group of types consisting of a number of programming and erasure cycles applied to the given erasure block, a time that elapsed since a last programming operation applied to the given erasure block, a time-temperature integral estimated for the given erasure block, and an index of a last page written to the given erasure block.

28. The apparatus according to claim 26, wherein the at least one read parameter comprises a first temperature of the analog memory cells at a first time at which the given erasure block was programmed, and wherein the processor is configured to modify the read thresholds based on a difference between the first temperature and a second temperature of the analog memory cells at a second time at which the given erasure block is read.

29. The apparatus according to claim 21, wherein the processor is configured to update the stored sets with the adapted set of read thresholds upon successfully reading the first page.

30. The apparatus according to claim 21, wherein the processor is configured to store no more than a single respective set of read thresholds for each erasure block.

31. The apparatus according to claim 21, wherein the processor is configured to accept a read command from a host system, to read the first page in response to the read command, and to send the read first page to the host system.

32. The apparatus according to claim 31, wherein the threshold memory resides in a memory of the host system.

33. The apparatus according to claim 21, wherein the multiple sets are drawn from a predefined list of sets, and wherein storing the sets comprises storing respective indices of the sets in the list.

34. The apparatus according to claim 21, wherein the threshold memory comprises a volatile memory, wherein the analog memory cells comprise non-volatile memory cells, and wherein the processor is configured to copy the multiple sets from the threshold memory to the analog memory cells in response to an imminent disruption of electrical power, and to recover the multiple sets from the analog memory cells to the threshold memory following reapplication of the electrical power.

35. The apparatus according to claim 21, wherein the processor is configured to store in the threshold memory an indication of a successful readout scheme that previously succeeded in reading at least one page of the given erasure block, and to read the first page by retrieving the indication and reading the first page using the respective successful readout scheme.

36. The apparatus according to claim 35, wherein the successful readout scheme specifies at least one item selected from a group of items consisting of:
an Error Correction Code (ECC) decoding scheme that succeeded in decoding the at least one page;
a number of re-read operations that succeeded in reading the at least one page; and
a notification of whether interference cancellation was used in order to successfully read the at least one page.

37. The apparatus according to claim 35, wherein the indication is indicative of a number of errors that were encountered in the given erasure block.

38. The apparatus according to claim 21, wherein the processor is configured to select a readout scheme for reading the first page responsively to the stored set of read thresholds.

39. The apparatus according to claim 21, wherein the processor is configured to assess a quality of the given erasure block based on the stored set that is associated with the given erasure block.

40. The apparatus according to claim 21, wherein the processor is configured to store a quality of the given erasure block in the threshold memory.

41. Apparatus for data storage, comprising:
- a non-volatile memory, which comprises a plurality of analog memory cells that are arranged in multiple erasure blocks each comprising multiple pages;
- a threshold memory; and
- a processor, which is configured to store multiple sets each comprising one or more read thresholds for use in reading data from the analog memory cells, such that each set of read thresholds is associated with a respective page in one of the erasure blocks, to read a first page, which belongs to a given erasure block and is not associated with any of the sets of read thresholds stored in the threshold memory, by retrieving from the threshold memory a stored set of read thresholds that is associated with a second page in the given erasure block, adapting the retrieved set of read thresholds to match the first page, and reading the first page using the adapted set of read thresholds.

* * * * *